United States Patent [19]

Tzeng

[11] Patent Number: 5,049,515
[45] Date of Patent: Sep. 17, 1991

[54] METHOD OF MAKING A THREE-DIMENSIONAL MEMORY CELL WITH INTEGRAL SELECT TRANSISTOR

[75] Inventor: Jyh-Cherng J. Tzeng, Sunnyvale, Calif.

[73] Assignee: Intel Corporation, Inc., Santa Clara, Calif.

[21] Appl. No.: 543,043

[22] Filed: Jun. 22, 1990

Related U.S. Application Data

[62] Division of Ser. No. 491,226, Mar. 9, 1990, Pat. No. 4,964,080.

[51] Int. Cl.⁵ .............................................. H01L 21/70
[52] U.S. Cl. ......................................... 437/43; 437/38; 437/51; 437/52; 437/191; 437/193; 437/228; 437/233; 437/235
[58] Field of Search ...................... 437/38, 43, 51, 52, 437/191, 193, 228, 233, 235; 357/23.5; 365/185

[56] References Cited
U.S. PATENT DOCUMENTS

| | | | |
|---|---|---|---|
| 4,222,062 | 9/1980 | Trotte et al. | 365/185 |
| 4,713,677 | 12/1987 | Tigebar et al. | 365/185 |
| 4,796,228 | 1/1989 | Bagbe | 365/185 |
| 4,814,840 | 3/1989 | Kameda | 365/185 |

*Primary Examiner*—Brian E. Hearn
*Assistant Examiner*—Tom Thomas
*Attorney, Agent, or Firm*—Blakely, Sokoloff, Taylor & Zafman

[57] ABSTRACT

A three-dimensional floating gate memory cell including an integral select gate transistor is disclosed. Source and drain are formed in a silicon substrate wherein the drain is formed under a slot which has been etched into the body of the substrate. In this way, the channel defined between the source and drain has both horizontal and vertical regions. The cell also includes a floating gate, which is completely surrounded with insulation, and a control gate which is insulated above and extends over the floating gate. The control gate is also insulated above and extends over the vertical portion of the channel within the slot. This allows the second gate member to regulate the current flowing in the vertical portion of the channel; that is, the second gate member and the vertical channel section form an integral select device.

14 Claims, 5 Drawing Sheets

FIG_1
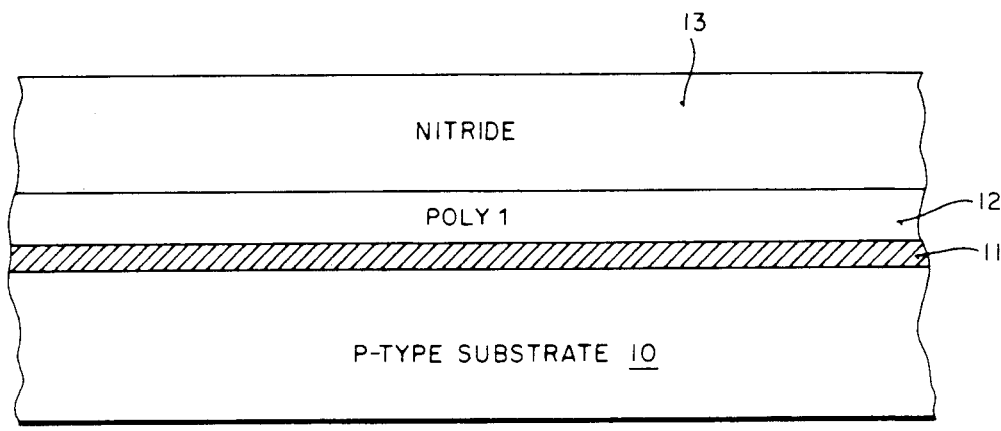
FIG_2
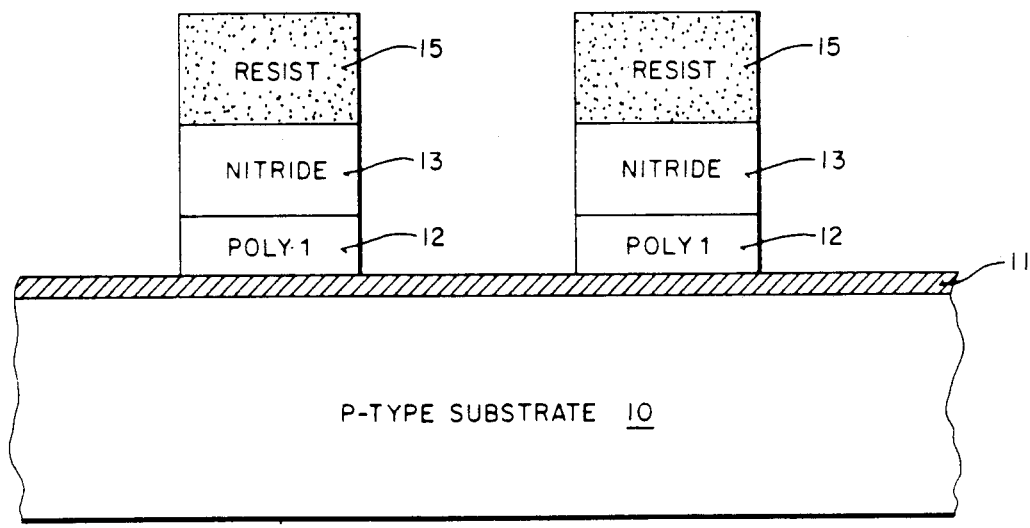

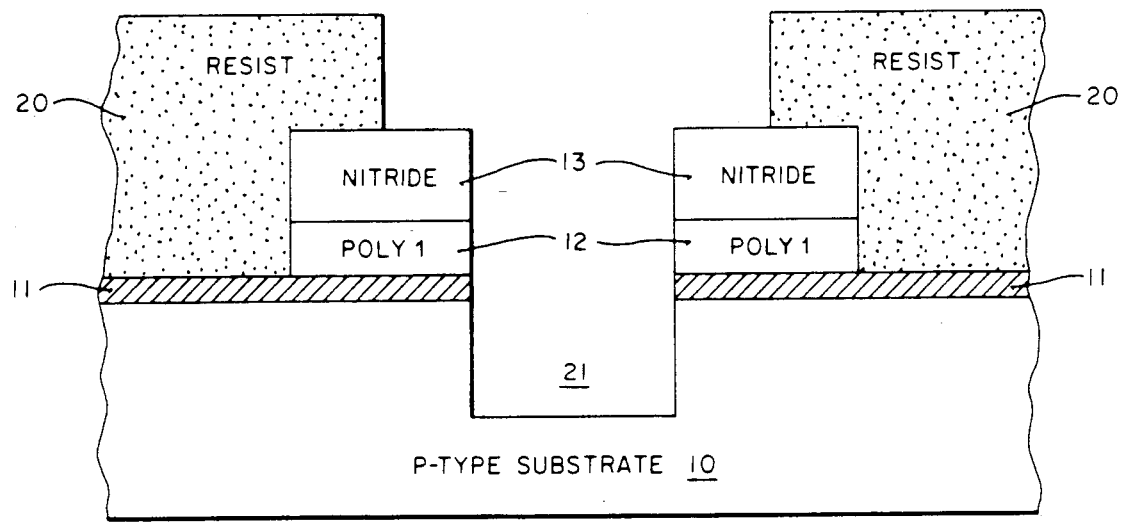
FIG_3
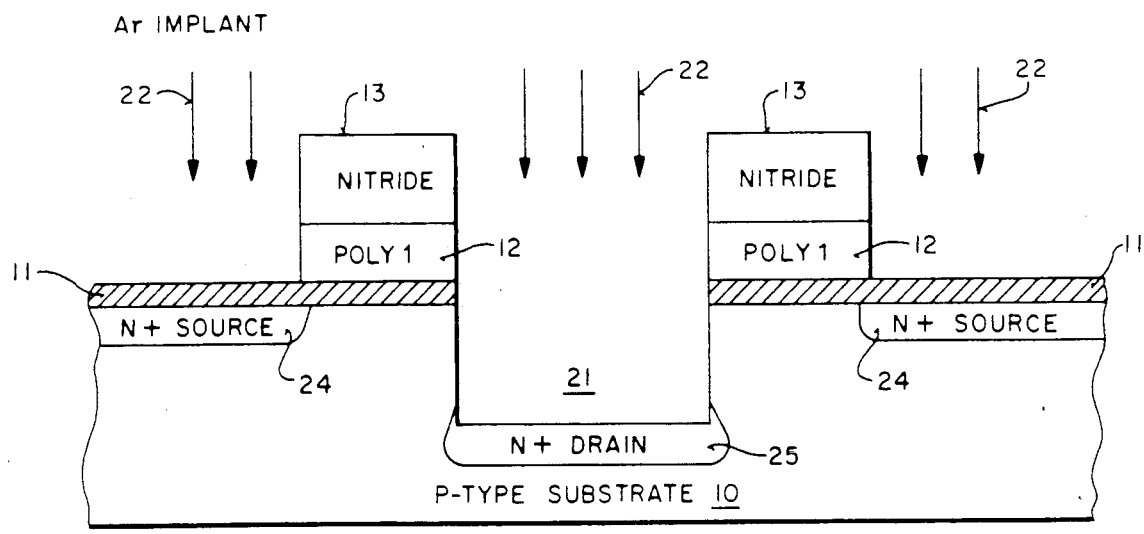
FIG_4

FIG_5
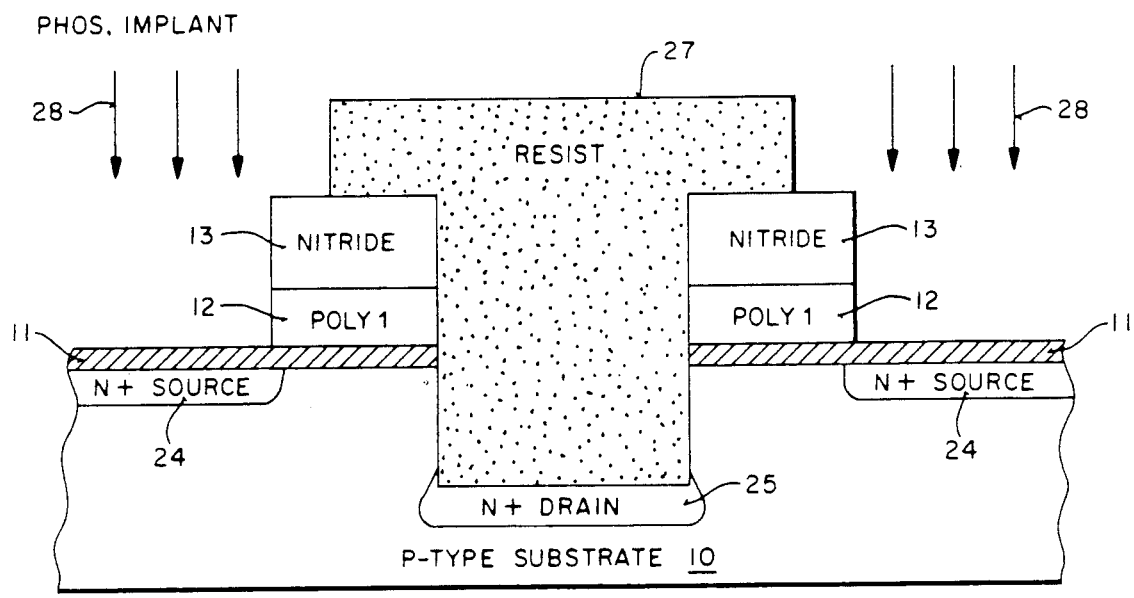
FIG_6
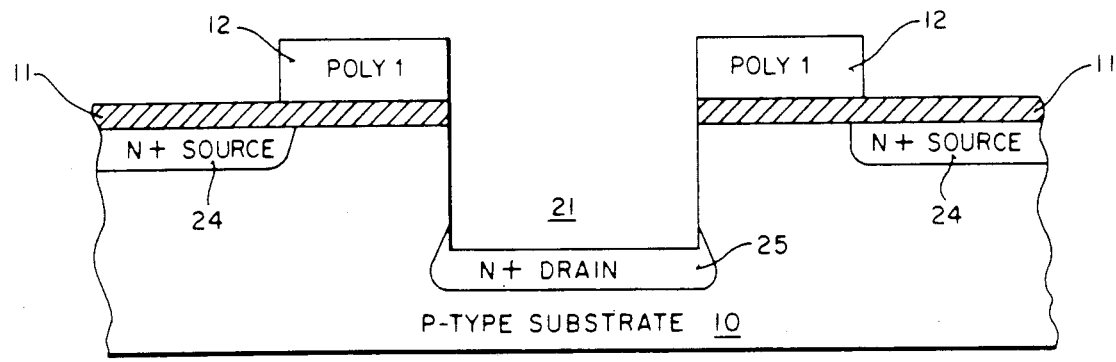

FIG_7
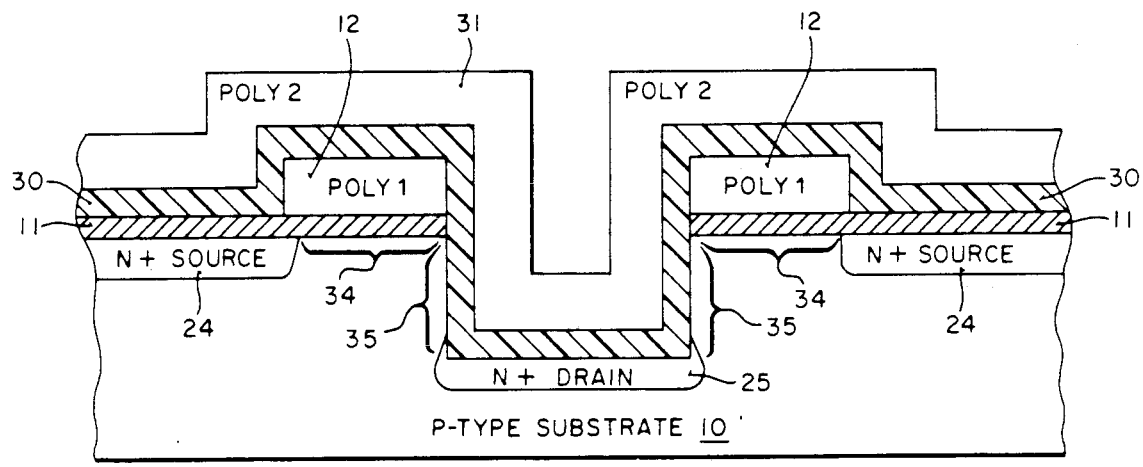
FIG_8
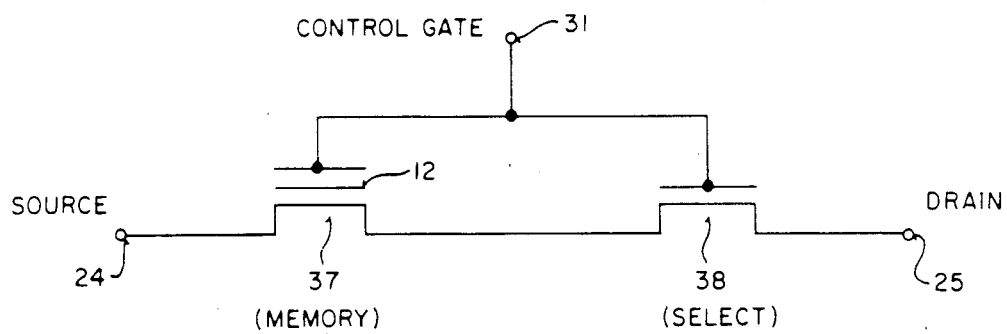

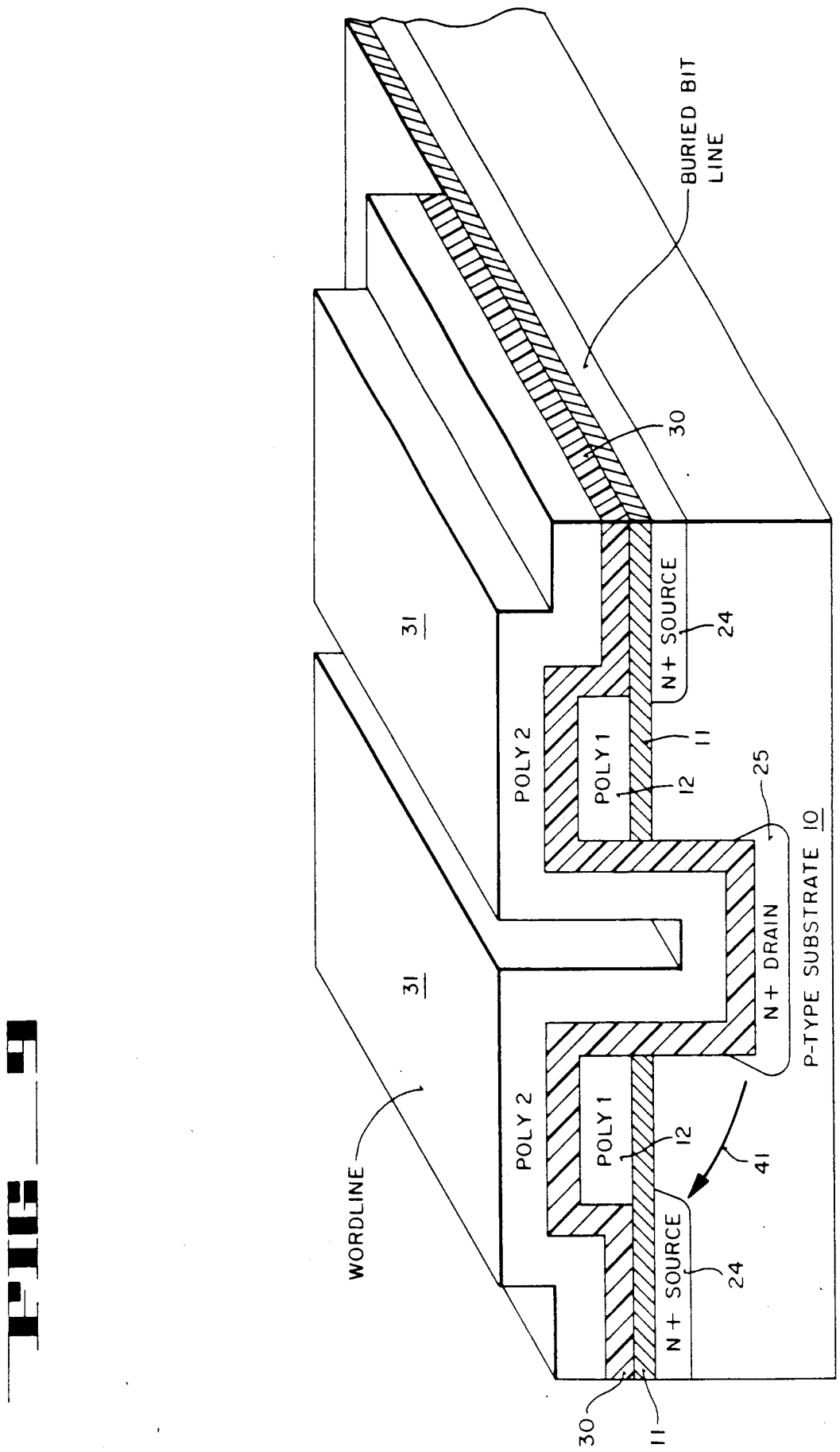
FIG._9

METHOD OF MAKING A THREE-DIMENSIONAL MEMORY CELL WITH INTEGRAL SELECT TRANSISTOR

This is a divisional of application Ser. No. 07/491,226 filed Mar. 9, 1990, now U.S. Pat. No. 4,964,080.

RELATED APPLICATIONS

This application is related to co-pending U.S. patent application entitled, "A Three-Dimensional Contactless Non-Volatile Memory Cell and Process for Fabricating the Same", filed Feb. 22, 1990; Ser. No. 07/483,466; which is assigned to the assignee of the present invention.

FIELD OF THE INVENTION

The present invention relates to the field of semiconductor memory devices employing floating gates and their methods of fabrication; most particularly, to those devices incorporating an integral select transistor.

BACKGROUND OF THE INVENTION

Non-volatile semiconductor memory cells employing floating gates which are completely surrounded by an insulative layer such as silicon dioxide are well-known in the prior art. Typically, a polycrystalline silicon (polysilicon) layer is used to form the floating gates. Charge is transferred to the floating gates through a variety of mechanisms such as avalanche injection, channel injection, tunnelling, etc.

The charge on the floating gate affects the surface channel conductivity in the cell. If the conductivity is above a certain level, the cell is deemed to be programmed in one binary state, and if the conductivity is below another level it is deemed to be programmed in the opposite binary state. These cells are referred to in the prior art as EPROMs, EEPROMs, flash EPROMs and flash EEPROMs.

In general, an EPROM or an EEPROM comprises a silicon substrate including source and drain regions which define a channel therebetween. Disposed above the channel is a polysilicon floating gate. The floating gate separated from the substrate by a relatively thin gate insulative layer. A control gate is disposed above, and insulated from, the floating gate. The control gate is also commonly fabricated of polysilicon. An example of this category of device is shown in U.S. Pat. No. 3,500,142 and in U.S. Pat. No. 4,203,158.

In the case of a flash EEPROM cell, electrons (i.e., charge) are stored on the floating gate in a capacitive manner. For these devices the memory cell comprises only a single device and the entire memory array is erased at one time. That is, individual cells or groups of cells are not separately erasable as in current EEPROMs. A flash EEPROM or flash EPROM device is disclosed in co-pending application Ser. No. 07/253,775, filed Oct. 5, 1988, entitled, "Low Voltage EEPROM Cell", assigned to the assignee of the present invention. U.S. Pat. No. 4,698,787 of Mukherjee et al., also discloses an electrically erasable programmable memory device which is programmed by hot-electron injection from the channel onto the floating gate and erased by Fowler-Nordheim tunnelling from the floating gate to the substrate.

Recently, much attention has been focused on contactless, electrically programmable and electrically erasable memory cell arrays of the flash EEPROM variety. In the contactless array, cells employ elongated source/drain regions which are sometimes referred to a "buried bit lines". These cells often require virtual ground circuitry for sensing and programming. An example of this type of array and a process for fabricating the same is disclosed in U.S. Pat. No. 4,780,424, which application is assigned to the assignee of the present invention. In certain instances, the drain regions are shallow compared to the source regions, while the source regions have more graded junctions. The floating gates are formed over a tunnel oxide disposed between the source and drain regions. Word lines are generally disposed perpendicular to the source and drain regions.

The principle upon which these EEPROM cells operate is that electrons (i.e., charge) are stored on the floating gate in a capacitive manner. By way of example, during programming of an EEPROM device, the control gate is usually taken to a high positive potential ranging between 12 and 20 volts. The source is grounded and the drain is taken to an intermediate potential of approximately 7 volts. This creates a high lateral electrical field within the channel region nearest to the drain. The high lateral electric field accelerates electrons along the channel region to the point where they become "hot". These hot-electrons create additional electron-hole pairs through impact ionization. A large number of these electrons are attracted to the floating gate by the large positive potential on the control gate.

During erasing of an EPROM device, the control gate is usually grounded and the drain is left unconnected. The source is taken to a high positive potential, creating a high vertical electric field from the source to the control gate. Charge is erased from the floating gate by the mechanism of Fowler-Nordheim tunnelling of electrons through the gate oxide region between the source and the floating gate in the presence of such a field.

One problem associated with prior art memory cells is that after the floating gate has been repeatedly erased the device can function as a depletion-mode device in which current flows when the threshold of the memory cell is below the gate bias during read operation. In other words, frequent erasing of the gate results in a lowered (i.e., negative) voltage threshold. The presence of a negative threshold voltage is problematic in that it can completely disable an entire column line within an array.

To combat this problem several prior art cells have incorporated select transistors into the basic memory cell design for the purpose of inhibiting current flow between the source and drain regions after the floating gate has been repeatedly erased. These designs inhibit current flow between source and drain in the over erased memory cell during read conditions. Thus, even if the floating gate is repeatedly erased, becoming and acting like a depletion-mode device, no current will flow. Such an EEPROM cell is shown in co-pending U.S. patent application entitled, "EEPROM Cell with Integral Select Transistor", filed 2/2/87; Ser. No. 07/009,998; which is assigned to the assignee of the present invention. Other memory cells incorporating a select gate architecture are disclosed in U.S. Pat. Nos. 4,087,795; 4,412,311; 4,590,503; 4,328,565; 4,622,656; and 4,258,378.

As will be seen, the present invention comprises an electrically erasable and electrically programmable memory cell with an integral select transistor. The select transistor is fabricated along a vertical dimension of the channel region to achieve a minimal area two-transistor memory cell. According to the present invention the achievable cell density is more than double that of prior art memory arrays.

SUMMARY OF THE INVENTION

A three-dimensional floating gate memory cell including an integral select gate transistor is described. In one embodiment, first and second spaced-apart regions of a second conductivity type are formed in a substrate of a first conductivity type. The second region is formed under a slot which has been etched into the body of the substrate. In this way, the channel defined between the first and second regions has a horizontal and a vertical section. The horizontal section begins at the edge of the first region and runs generally parallel to the upper surface of the substrate—ending at the edge of the slot. Meanwhile, the vertical section starts at the upper edge of the slot and runs generally vertically down to the edge of the second region. Because of the three-dimensional nature of the cell, current flows from the first region to the second across both the horizontal and vertical sections.

The cell also includes a first gate member which is completely surrounded with insulation. The first gate member extends form at least the edge of the first region to over the horizontal region of the channel. In accordance with well-known operating principles, the first gate stores a charge which affects the conductivity within the horizontal portion of the channel.

A second gate member is insulated above and extends over the first gate member and is used to control the programming and erasing of the memory cell. The second gate member is also insulated above and extends over the vertical portion of the channel within the slot. This allows the second gate member to regulate the current flowing in the vertical portion of the channel; that is, the second gate member and the vertical channel section form an integral select transistor.

When fabricated in an array, the second gate members are formed into sets of continuous word lines which completely extend across individual rows of the array. For this type of embodiment, the first and second regions are formed into elongated, parallel, spaced-apart bit lines which likewise extend across individual columns of the array. Each word line is patterned so as to be generally perpendicular to the parallel source and drain regions.

One important feature of the present invention is the integration of a select transistor into a non-volatile memory cell without a corresponding increase in the lateral dimension of the cell. Furthermore, by forming the first polysilicon layer sufficiently thick, capacitive coupling to the second gate member along both the horizontal as well as the vertical surfaces of the first gate member. In other words, the vertical dimension of the floating gate can be made to contribute to the total capacitive coupling area between the first and second gate members.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein;

FIG. 1 is a cross-sectional elevation view of a substrate which includes a gate oxide over which has been deposited a polysilicon layer and an additional nitride layer.

FIG. 2 illustrates the substrate of FIG. 1 after photoresist masking members have been formed and the underlying nitride/polysilicon layers have been etched.

FIG. 3 illustrates the substrate of FIG. 2 following an etch of the underlying substrate to form a slot between adjacent memory cells.

FIG. 4 illustrates the substrate of FIG. 3 following the ion implantation of arsenic into the source/drain regions of the devices.

FIG. 5 illustrates the substrate of FIG. 4 following another ion implantation of phosphorus into the source regions.

FIG. 6 illustrates the substrate of FIG. 5 following removal of the photoresist and nitride layers.

FIG. 7 illustrates the substrate of FIG. 6 following deposition of an interpoly dielectric layer and a second polysilicon layer.

FIG. 8 is an equivalent schematic drawing of the device illustrated in FIG. 7.

FIG. 9 is a perspective view of the cross-sectional elevation view of FIG. 4. FIG. 9 shows the location of the bit line and word line.

DESCRIPTION OF THE PREFERRED EMBODIMENT(S)

A novel three-dimensional non-volatile memory device is disclosed which utilizes both the vertical and the planar gate dimensions to integrate a memory cell with a select device in a minimal area. In the following description, numerous specific details are set forth such as specific doping levels, dimensions, etc., in order to provide a thorough understanding of the present invention. It will be obvious, however, to one skilled in the art that these specific details need not be employed to practice the present invention. In other instances, well-known processing steps are not described in detail in order not to unnecessarily obscure the present invention.

The memory cells of the present invention are fabricated using standard metal-oxide-semiconductor (MOS) processing. The array which contains the cells, in the currently preferred embodiment is fabricated of n-channel devices. A peripheral circuit can employ either n-channel devices or complimentary MOS devices.

With reference to FIG. 1, initially the entire substrate is subjected to a thermal oxidation cycle to grow a gate oxide 11 over p-type monocrystalline silicon substrate 10. Gate oxide 11 is a high-grade thermal oxide which in the currently preferred embodiment assumes a thickness of approximately 110 Å. Note that this thickness is typical for flash applications but may vary for other types of device structures or applications.

By growing the gate oxide (also known as the tunnel oxide) at the beginning of the process, erasing operations are improved as compared to prior art approaches. In prior art cells the tunnel oxide is usually grown after the formation of field oxidation regions or after the source/drain implants have been performed. Both of these processing steps may degrade the quality of the gate oxide. For example, a high temperature thermal oxidation cycle for growing field oxide regions normally produces a great deal of stress in the neighboring gate oxide regions. Field oxide growth also destroys the planarity of the substrate surface at the ends of the active regions.

Optionally, a voltage threshold adjusting implant may be performed before growth of the gate oxide 11. This threshold adjusting implant ordinarily consists of a combination of low and high energy boron implants.

After the gate oxide is formed, a layer of polysilicon 12 is then deposited over the substrate. In the currently preferred embodiment, the thickness of polysilicon layer 12 is on the order of 2000 Å. However, thicker polysilicon layers (e.g., 7500 Å) may be deposited depending on specific design considerations. As will be discussed in more detail later, the height of first polysilicon layer 12 may be increased to provide greater capacitive coupling to the control gate.

Next, a silicon nitride layer 13 is formed on top of first polysilicon layer 12 either by chemical vapor deposition (CVD). The thickness of this nitride layer is generally on the order of 500 Å. The purpose of nitride layer 13 is to protect the underlying polysilicon layer 12 from being doped or etched during subsequent processing steps.

Referring now to FIG. 2, a single photoresist masking layer 15 is used to define the active channel area for the devices within the array. The portions of nitride layer 13 and polysilicon layer 12 which are not covered by photoresist layer 15 are anisotropically etched away. The polysilicon regions underlying masking members 15 are protected during the etching step, with the result being that elongated, parallel, spaced-apart poly 1 strips 12 are formed over gate oxide 11.

Following the removal of masking members 15, a new photoresist masking layer 20 is used to form slot 21 in substrate 10, as depicted in FIG. 3. Once again, an anisotropic plasma etch is used to remove oxide 11 and the underlying substrate 10 which is not protected by either masking members 20 or nitride layer 13. The vertical depth of slot is preferably about 0.3 microns below the upper surface of substrate 10; however, it is appreciated that the depth of slot 21 may vary depending on the particular device parameters desired.

After the removal of photoresist members 20, substrate 10 is subjected to an arsenic implant as indicated by arrows 22 in FIG. 4. This implant penetrates through tunnel oxide layer 11 into p-type substrate 10, but not into the polysilicon strips or the underlying substrate regions protected by nitride members 13. In the presently preferred embodiment, arsenic is implanted to a level of $1 \times 10^{15}/cm^2$ to $5 \times 10^{15}/cm^2$. This implant forms elongated, parallel, spaced-apart doped regions 24 and 25 (i.e., source and drain, respectively) in the substrate. Note that nitride members 13 serve as the active channel definition mask as well as the polysilicon floating gate mask. This approach saves one critical mask in the process flow and also eliminates the possibility of registration error between masking steps.

Next, as illustrated in FIG. 5, alternate ones of the elongated regions between the polysilicon members 12 are covered with a photoresist masking member 27 to protect slot 21 and the underlying drain region 25 from exposure during the subsequent ion implant step. The source regions 24 are then subjected to an additional phosphorous implant as shown by arrows 28. In the currently preferred embodiment, regions 24 are implanted with phosphorous to a level of approximately $0.5 \times 10^{15}/cm^2$ to $1 \times 10^{15}/cm^2$. (It should be understood that the additional phosphorous implant 21 is an optional step, generally only required when fabricating flash-type devices, and may be eliminated for ordinary EPROMs or EEPROMs).

Because of the rapid diffusion properties of phosphorus, this additional implant produces a source region which is relatively deeper and more graded when compared to the drain. Also note that following implant 28 each source region partially extends under its respective floating gate member 12. This facilitates the tunnelling of electrons from floating gate 12 to source 24 during erase operations.

After the phosphorus implant, photoresist member 20 is removed along with nitride layer 13. FIG. 6 illustrates two adjoining cells fabricated up to this point in the process.

A layer of silicon dioxide, or preferably an interpoly dielectric layer 30 comprising a silicon dioxide/silicon nitride/silicon dioxide (ONO) stack, is then deposited over the floating gates 12 as shown in FIG. 7. Note that layer 30 continuously extends over gate 12, vertical sidewall section 35, and drain 25. The thickness of interpoly dielectric 30 is approximately 200 Å in the currently preferred embodiment.

After the formation of layer 30, a second polysilicon layer 31 is conformably deposited over the substrate to a preferred thickness of approximately 3000 Å. This second polysilicon (poly 2) layer is masked and layers 31, 30 and 12 are etched to define the control gate and the floating gates for the array. This etching step effectively patterns poly 2 layer 31 into word lines which completely cover the floating gates. FIG. 9 is a perspective view of the device pair which clearly shows the relative locations of the bit lines (e.g., regions 24 and 25) and word line 31. Word line 31 is patterned so as to be generally perpendicular to the underlying bit lines while extending completely across a row of the array. Planarization, passivation, contact formation and metal line formation steps are then performed in an ordinary manner to complete the memory array.

Referring back to FIG. 7, a central feature of the present invention is the fact that the channel of each device is divided into two separate regions—a horizontal region 34, and a vertical region 35 located along the sidewall section of slot 21. The conductivity in vertical region 35 is modulated by gate 31, while the conductivity of horizontal region 34 is modulated (i.e., controlled) by the charge residing on floating gate 12.

FIG. 8 is an equivalent circuit representation of one of the devices illustrated in FIG. 7. Basically, the combination of control gate 31 and vertical channel region 35 form an ordinary n-channel field-effect transistor 38 coupled in series with the basic memory device 37 formed by gates 31 and 12 and channel region 34. As seen in FIG. 8, current flow from source 24 to drain 25 passes through transistors 37 and 38.

In operation, transistor 38 functions as a "select" transistor; preventing current flow between source and drain regions under conditions wherein memory transistor 37 has become depletion-like. As mentioned earlier, after the floating gate has been repeatedly erased, the memory cell can behave like a depletion-mode device in which current flows from source to drain during read operation. This condition is sometimes referred to as "over erasure". By integrating transistor 38 into the basic memory cell design, current flow in the channel can be prevented as long as control gate 31 is maintained at a potential of 0 Volts (or lower). Consequently, the present invention relieves the problem of over erasure and provides an important advantage over prior art memory cells which do not employ a select transistor.

Astonishingly, this advantage is achieved in a total cell area which is smaller than the device area of most single transistor memory cells. This is because the select transistor is integrated vertically in the cell, and not horizontally. (Note that the individual memory cells of the present invention comprise the combined area of transistors 37 and 38). Indeed, recessing the drain region of the device provides a larger effective channel length in a smaller horizontal geometry. This longer effective channel length also means that the device can tolerate more strenuous punch-through conditions since the source and drain are now at different levels, or planes, within the substrate. (The punch-through current path is indicated by arrow 41 in FIG. 9).

Practitioners in the art will further appreciate that the vertical dimension 40 of the polysilicon floating gates 12 effectively increases the capacitive coupling between the floating gate and the control gate without enlarging the horizontal dimension of the cell. In the preferred embodiment, this vertical dimension, is typically about 2000 Å. However, by further increasing the vertical height of floating gate 12, capacitive coupling can be enhanced without a corresponding increase in the lateral dimension of the device. Thus, overall cell density is greatly improved.

An additional feature characteristic of the array of FIG. 7 is the absence of field oxide or other thick oxide regions (e.g., a self-aligned thick oxide region, commonly known as "SATO") separating each of the devices within the array. In the prior art, thick oxide regions are required to minimize first polysilicon (poly 1) to source/drain capacitance. However, in obviating the large lateral first polysilicon dimension, the corresponding need for thick oxide isolation regions is likewise eliminated. Of course, isolation in the form of field oxide may still be required in the periphery cells, even though it is unnecessary in the core array.

Also note that within the array, adjacent cells share common bit lines. By way of example, in FIG. 7 adjacent memory cells share a common n+ drain 25. For this reason each memory cell does not require a separate set of contacts, i.e., the invented memory cell and array are referred to a "contactless". Of course, metal contacts are needed along the periphery of the array for connection to each word line and bit line. In this respect a memory array incorporating the invented cell.

Capacitive coupling between the floating gate and control gate members may be increased in the process simply by increasing the vertical dimension of first polysilicon member 12. As explained above, the increased coupling capacitance is achieved without a corresponding increase in the lateral dimension of the device. In the currently preferred embodiment, total channel widths (the sum of the vertical and horizontal components) for individual memory cells are on the order of 1.0 microns in width. Furthermore, the elimination of field oxide regions from the memory of the present invention markedly reduces stress in the tunnel oxide regions; thereby providing superior programming and erase performance.

In operation, programming the EEPROM cell of the present invention is achieved by raising the drain 25 and control gate 31 to predetermined potentials above that of the source 24. In the preferred embodiment, the drain and control gate are typically raised to 12 Volts and the source is grounded. Under these conditions hot-electrons are generated due to the high lateral electric field created between source and drain. A number of these electrons are accelerated across gate oxide 11 and onto floating gate 12. Injection normally occurs at the portion of oxide 11 near the corner formed by the intersection of regions 34 and 35 (see FIG. 7).

Erasing is achieved in a conventional manner by floating the drain while grounding the control gate and raising the source to a predetermined positive potential (12 Volts in the preferred embodiment). Under these conditions, Fowler-Nordheim tunnelling occurs between the floating gate 12 and the portion of the source diffusion which underlies the floating gate. Erasing reduces the threshold voltage of the cell to about zero volts.

Whereas many alternations and modifications of the present invention will no doubt become apparent to a person of ordinary skill in the art after having read the foregoing description, it is to be understood that the particular embodiments shown and described by way of illustration are in no way intended to be considered limiting. For example, in an alternative configuration layer 31 (i.e., the control gate) may extend from over the floating gate to the vertical sidewall portion of slot 21 only—without extending over any part of the drain region. Therefore, reference to the details of the preferred embodiments are not intended to limit the scope of the claims which themselves recite only those features regarded as essential to the invention.

Thus, a three-dimensional contactless non-volatile memory device with an integral select transistor has been described.

I claim:

1. A process for fabricating an array of floating gate memory cells with integral select transistors on a substrate comprising the steps of:
   forming a gate oxide on said substrate;
   forming a plurality of first gate members on said gate oxide from a first layer of polysilicon;
   forming a plurality of slots in said substrate between alternate pairs of said first gate members;
   introducing dopants into said substrate to form elongated, parallel, spaced-apart source and drain regions in alignment with said first gate members, said drain regions being formed beneath said slots;
   forming elongated second gate members from a second layer of polysilicon, said second gate members being formed over, and insulated from, said first gate members and said slots.

2. The process according to claim 1 wherein said first gate members are thick enough such that capacitive coupling to said second gate members curves along the horizontal and vertical surfaces of said first gate members.

3. The process according to claim 2 wherein said first gate members are approximately 2000 Å thick.

4. The process according to claim 3 wherein said gate oxide is approximately 110 Å thick.

5. The process according to claim 4 wherein said slot is approximately 0.3 microns deep.

6. The process according to claim 5 wherein said introducing step includes implanting arsenic ions into said substrate.

7. A process for fabricating an array of floating gate memory cells with integral select transistors on a silicon substrate comprising the steps of:
   (a) forming a gate oxide on said substrate;

(b) depositing a first layer of polysilicon over said gate oxide;

(c) depositing a masking layer over said first polysilicon layer;

(d) etching said first polysilicon layer to form a plurality of first gate members;

(e) forming a plurality of slots in said substrate between alternate pairs of said first gate members, each of said slots having a bottom surface and a pair of sidewall surfaces;

(f) implanting dopants into said substrate to form elongated, parallel, spaced-apart source and drain regions in alignment with said first gate members, said drain regions being formed beneath said bottom surface of said slots;

(g) forming elongated second gate members from a second layer of polysilicon, said second gate members being formed over, and insulated from, said first gate members and said slots such that said second gate members and said sidewall surfaces form said select transistors.

8. The process according to claim 7 wherein said first gate members are thick enough such that capacitive coupling to said second gate members takes place along the horizontal and vertical surfaces of said first gate members.

9. The process according to claim 8 wherein said first gate members are approximately 2000 Å thick.

10. The method of claim 9 wherein said gate oxide is approximately 110 Å thick.

11. The method of claim 7 wherein said masking layer comprises silicon nitride.

12. The process according to claim 11 wherein said first gate members are insulated from said second gate members by an interpoly dielectric comprising a first layer of silicon dioxide, a layer of silicon nitride and a second layer of silicon dioxide.

13. The process according to claim 12 wherein said second gate members are formed generally perpendicular to said elongated source and drain regions.

14. The process according to claim 13 further comprising the step of optionally performing a threshold adjusting implant prior to the formation of said gate oxide.

* * * * *